US007542300B1

(12) United States Patent
Lui et al.

(10) Patent No.: US 7,542,300 B1
(45) Date of Patent: Jun. 2, 2009

(54) STORAGE SYSTEM CHASSIS AND COMPONENTS

(75) Inventors: Kwok Lui, Sunnyvale, CA (US); Dan Ho, Fremont, CA (US); David Willheim, Los Gatos, CA (US); Salvatore Bondi, San Francisco, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 493 days.

(21) Appl. No.: 11/072,622

(22) Filed: Mar. 4, 2005

(51) Int. Cl.
*H05K 5/00* (2006.01)
*H05K 7/16* (2006.01)
*A47B 81/00* (2006.01)

(52) U.S. Cl. .................. 361/755; 361/726; 361/727; 361/759; 312/223.2; 454/184

(58) Field of Classification Search .......... 361/695, 361/726–727, 755, 759; 312/236, 223.2; 454/184
See application file for complete search history.

(56) References Cited

U.S. PATENT DOCUMENTS

| 3,413,050 | A | * | 11/1968 | Sommers et al. | ............ | 312/107 |
| 4,014,598 | A | * | 3/1977 | Stalley et al. | ............... | 312/236 |
| 4,238,139 | A | * | 12/1980 | Suzuki et al. | .................. | 312/7.1 |
| 4,926,291 | A | * | 5/1990 | Sarraf | ......................... | 361/685 |
| 5,351,176 | A | * | 9/1994 | Smith et al. | .................. | 361/681 |
| 5,379,184 | A | * | 1/1995 | Barraza et al. | .............. | 361/685 |
| 5,460,441 | A | * | 10/1995 | Hastings et al. | ............. | 312/298 |
| 5,505,533 | A | * | 4/1996 | Kammersqard et al. | ..... | 312/236 |
| 6,025,989 | A | * | 2/2000 | Ayd et al. | .................... | 361/695 |
| 6,137,684 | A | * | 10/2000 | Ayd et al. | .................... | 361/727 |
| 6,181,549 | B1 | * | 1/2001 | Mills et al. | ................... | 361/683 |
| 6,186,889 | B1 | * | 2/2001 | Byrne | ........................ | 454/184 |
| 6,297,962 | B1 | * | 10/2001 | Johnson et al. | ............. | 361/726 |
| 6,421,215 | B1 | * | 7/2002 | Bushue | ....................... | 361/93.1 |
| 6,466,448 | B1 | * | 10/2002 | Baik | .......................... | 361/752 |
| 6,600,656 | B1 | * | 7/2003 | Mori et al. | ................... | 361/724 |
| 6,657,867 | B2 | * | 12/2003 | Smith | ......................... | 361/725 |
| 6,747,874 | B2 | * | 6/2004 | McKinnon et al. | .......... | 361/724 |
| 6,785,133 | B2 | * | 8/2004 | Barringer et al. | ............ | 361/694 |
| 6,934,786 | B2 | * | 8/2005 | Irving et al. | ................. | 710/300 |
| 6,980,435 | B2 | * | 12/2005 | Shum et al. | .................. | 361/695 |
| 6,988,626 | B2 | * | 1/2006 | Varghese et al. | .............. | 211/26 |
| 7,054,155 | B1 | * | 5/2006 | Mease et al. | ................ | 361/695 |
| 7,072,186 | B2 | * | 7/2006 | Hardt et al. | .................. | 361/727 |
| 2003/0206398 | A1 | * | 11/2003 | Stamos et al. | ............... | 361/686 |
| 2004/0062047 | A1 | * | 4/2004 | Camarota et al. | ........... | 362/399 |
| 2004/0240177 | A1 | * | 12/2004 | Suzuki et al. | ............... | 361/695 |
| 2005/0067358 | A1 | * | 3/2005 | Lee et al. | ...................... | 211/26 |

* cited by examiner

*Primary Examiner*—Jayprakash N Gandhi
*Assistant Examiner*—Bradley H Thomas
(74) *Attorney, Agent, or Firm*—Suiter Swantz pc llo

(57) ABSTRACT

The present invention is a computing appliance chassis assembly which may support an integration of a plurality of removable modules, including fan modules, power supplies, and a controller module. The computing appliance chassis assembly may also include detachable handles which may allow transport of the computing appliance chassis assembly. A controller chassis may be installed within the computing appliance chassis assembly. A controller chassis assembly may house a controller module and may include rotatable side panels which allow easier access to the components of the controller module. A fan chassis assembly may also be installed within the computing appliance chassis and may house a fan module.

29 Claims, 18 Drawing Sheets

STORAGE SYSTEM CHASSIS AND COMPONENTS

FIELD OF THE INVENTION

The present invention generally relates to the field of computing appliances, and more particularly to a chassis assembly of a computing appliance.

BACKGROUND OF THE INVENTION

The efficient and precise storage of electronic data is one of the most important considerations of modern life. Businesses, schools and governments rely upon mass storage in daily operations. Consequently, mass storage systems have been developed to provide persistent and reliable data storage.

A typical storage system may include a computing appliance which may be operatively coupled to mass storage devices according to various communication protocols. A computing appliance may refer to a programmable machine capable of executing a list of instructions. A computing appliance may include a processing unit which executes instructions and memory for storage of data and execution instructions. A mass storage device may refer to devices for retention of data, including floppy disks, hard disks, optical disks, tapes and the like. In applications where mass storage is necessary, it is commonplace to store computing appliances within storage racks. A storage rack allows mounting of a plurality of computing appliances in an organized fashion. A storage rack may also ensure protection of the computing appliances and may allow for proper ventilation.

For optimal operation of a storage system, maintenance may be necessary. For example, components may require replacement. Additionally, new components may be required to support expanding data storage requirements. Conventional computing appliances include components which are mounted securely within the chassis of the computing appliance. A problem associated with a conventional chassis is the difficulty associated with maintenance of the computing appliance when components are mounted within the chassis in a conventional manner. For example, an information technology (IT) administrator (a person) may be required to physically remove a computing appliance from a storage rack, remove the housing of the computing appliance by unfastening a plurality of fasteners and further remove a particular component within the chassis of the computing appliance by unfastening additional fasteners and the like. Re-installation of a repaired component within the chassis of the computing system, re-installation of the computing system within the storage rack, and coupling of the various communication and power cables may also be similarly burdensome.

Consequently, an improved chassis for computing appliances of storage systems and improved arrangement of components within the computing appliance is necessary.

SUMMARY OF THE INVENTION

Accordingly, the present invention is directed to an apparatus including a computing appliance chassis assembly which may support an integration of a plurality of removable modules, including fan modules, power supplies, and a controller module. The computing appliance chassis assembly may also include detachable handles. The detachable handles may allow transport of the computing appliance chassis assembly and may be removed without tools when the computing appliance chassis assembly is mounted within a storage rack.

The present invention is further directed to a controller chassis for housing a controller module in accordance with an embodiment of the invention. The controller chassis may include rotatable side panels which allow easier access to the components of the controller module. The controller chassis may also include a removable cable tray and a latching paddle to prevent unintended removal of the controller chassis from the computing appliance chassis assembly.

The present invention is further directed to a fan chassis for housing a fan module in accordance with an embodiment of the invention. The fan chassis may be removably mounted within the computing appliance chassis assembly. The fan chassis may include a handle. The handle of the fan chassis may also include a lightpath for a visible alert. When a fan module fails, a visible alert may light. The lightpath may enhance the ability to detect the visible alert. The fan chassis may also include a detachable visible display module which may provide status and operating information for the computing appliance chassis assembly.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
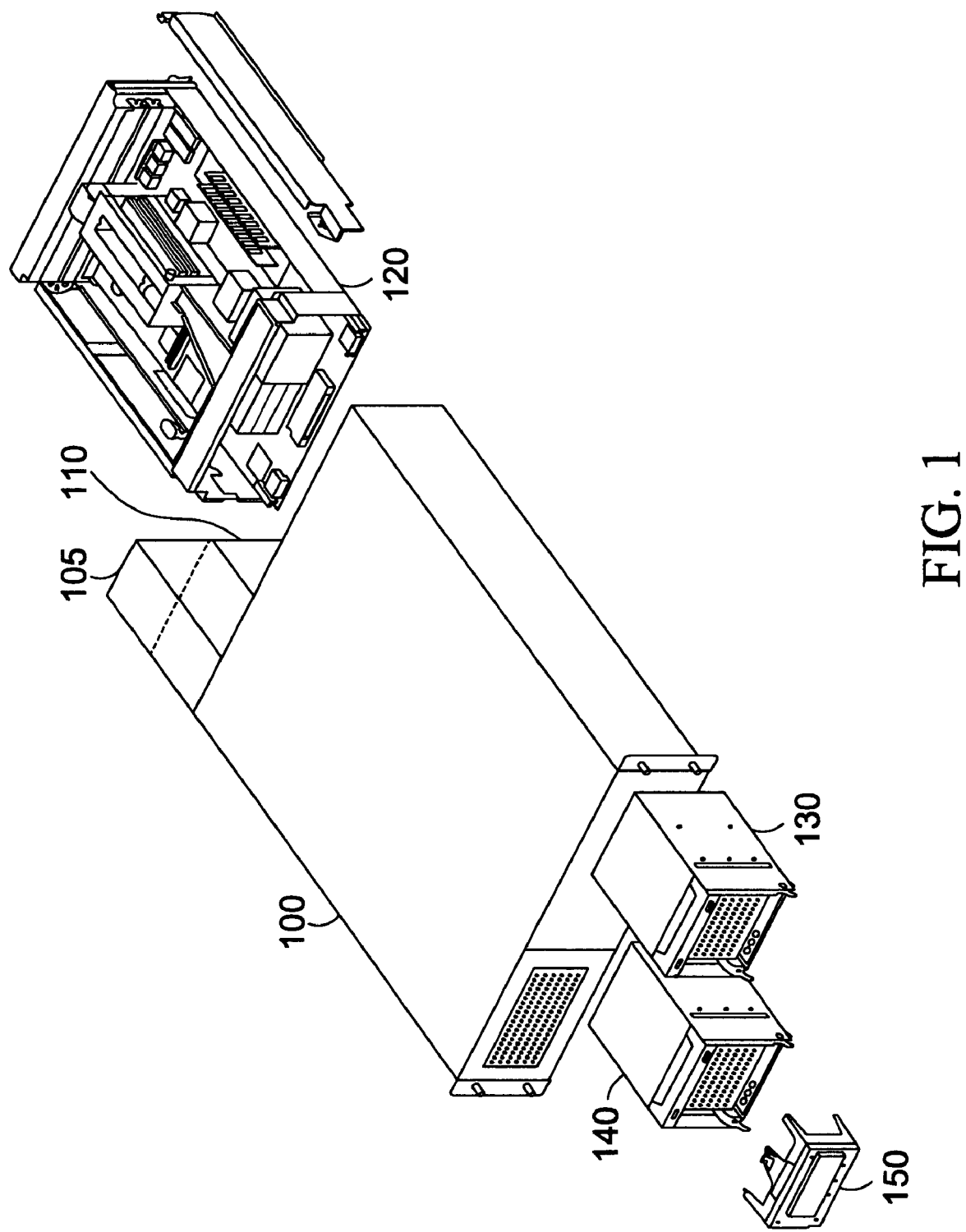
FIG. 1 depicts a computing appliance chassis assembly in accordance with an embodiment of the invention.

Referring to FIG. 1, a computing appliance chassis assembly 100 in accordance with an embodiment of the invention is shown. Computing appliance chassis assembly 100 may be suitable for housing a plurality of modularized components, such as power supplies 105, 110, a controller module and fan modules. Controller module may be housed within a controller chassis 120 which is removably mountable within the computing appliance chassis assembly 100. Fan modules may be housed within fan chassis 130, 140 which may also be removably mountable within computing appliance chassis assembly 100. Computing appliance chassis assembly 100 may include two sides, a top and a base section. The two sides, top and base section may be constructed of a rigid metal. The height of each side may be suitable for providing a secure fit for each module, the secure fit allowing for a spring-loaded latch to secure the modules. A detachable visible display module 150 may be provided and may be mounted to a side of the fan chassis assembly 140. In an embodiment of the invention, visible display module 150 may be a liquid crystal display (LCD). Visible display module 150 may provide status and operating information regarding the computing appliance chassis assembly 100.

Computing appliance chassis assembly 100 may allow for efficient maintenance and repair. In one embodiment of the invention, power supplies 105, 110, controller chassis 120 and fan chassis 130, 140 may include spring-loaded latches whereby the latches are locked when the device is installed within the computing appliance chassis assembly 100. Power supplies 105, 110 and controller chassis 120 may be removed from a rear portion of the computing appliance chassis assembly. Fan chassis 130, 140 may be removed from a front portion of the computing appliance chassis assembly 100. For example, fan chassis 130 may need replacement. Fan chassis 130 may be secured within computing appliance chassis assembly 100 via a spring-loaded latch. Thus, in an exemplary fashion, a failed fan module may be quickly and easily replaced via a release of the spring-loaded latch.

Figure 2A:
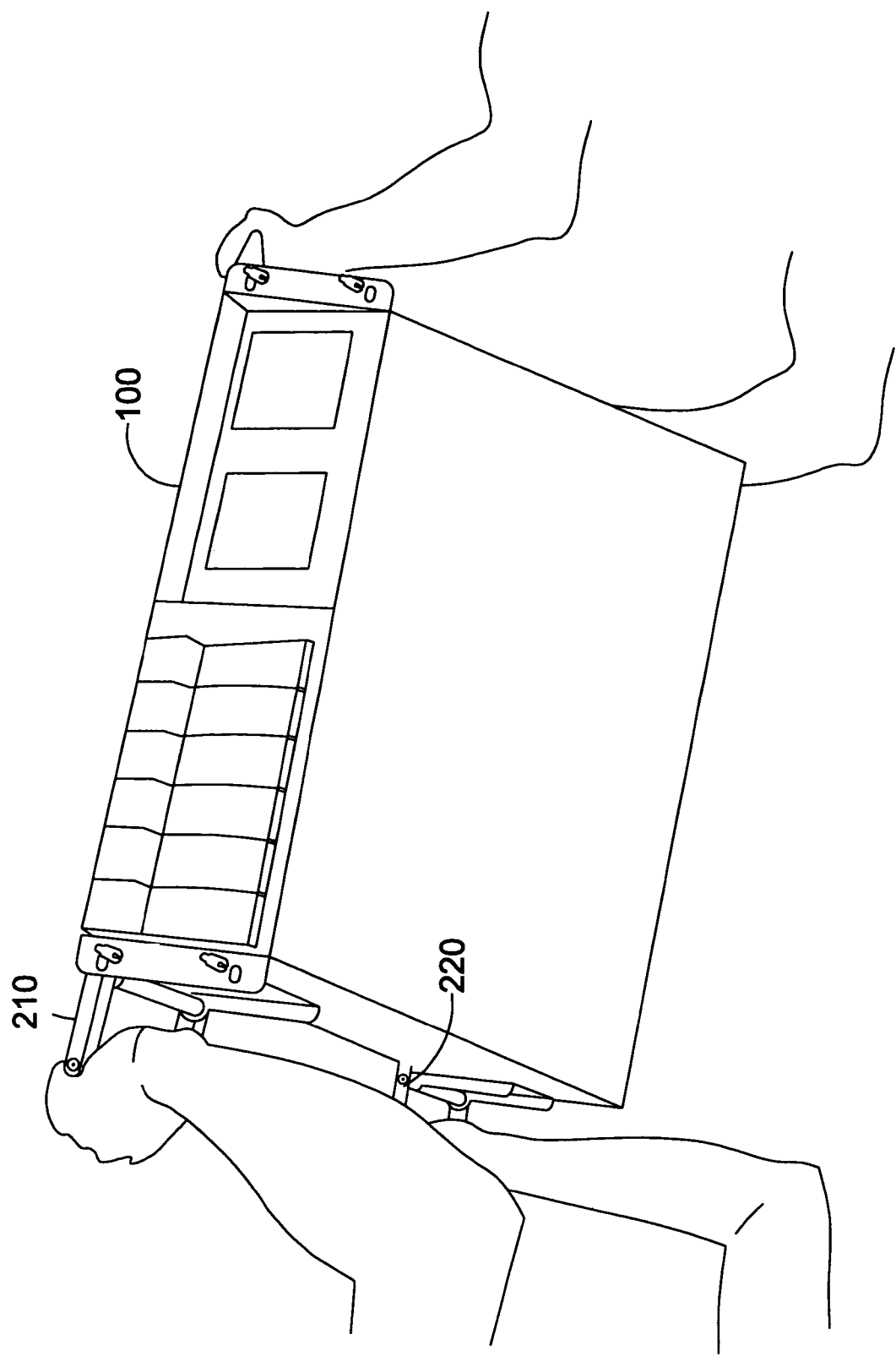
FIG. 2A depicts a computing appliance chassis assembly including removable handles in accordance with an embodiment of the invention.

Referring now to FIG. 2A, a computing appliance chassis assembly 100 including removable handles 210, 220 in accordance with an embodiment of the invention is shown. Computing appliance chassis assembly 100 may house a plurality of components and modules, including power supplies, fan modules, controller module and the like as described in FIG. 1. Consequently, the computing appliance chassis assembly 100 may be heavy, and the weight distribution of the chassis assembly 100 may be uneven. Removable handles 210, 220 may allow easier transport of the computing appliance chassis assembly by two people whereby two handles may be provided on each side of the chassis assembly 100. Placement of the handles 210, 220 may allow ergonomic lifting of the computing appliance chassis assembly. In an embodiment of the invention, handles may be removable. This may allow transport of the chassis assembly 100 when the handles are installed. When handles have been removed and are detached from the computing appliance chassis assembly 100, computing appliance chassis assembly 100 may be suitable for mounting within a storage rack.

Figure 2B:
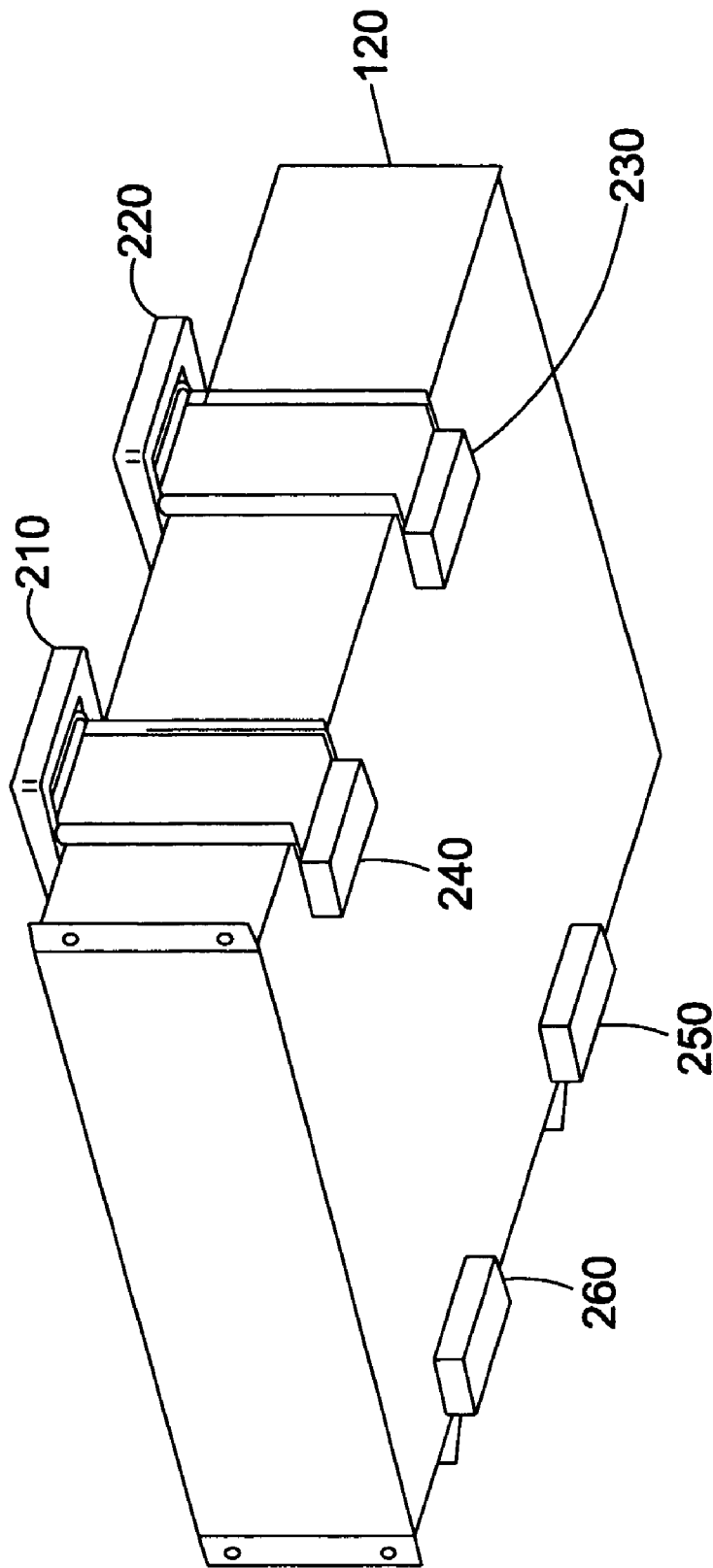
FIG. 2B depicts a computing appliance chassis assembly including removable handles with integrated cushioning devices in accordance with an embodiment of the invention.

Referring to FIG. 2B, a computing appliance chassis assembly 100 including removable handles 210, 220 with integrated cushioning devices 230, 240, 250, and 260 in accordance with an embodiment of the invention is shown. Integrated cushioning devices 230, 240, 250, and 260 may be mounted to a handle assembly for removable handles 210, 220. Integrated cushioning devices may provide shock protection through dampening to minimize damages to components within the computing appliance chassis assembly 100.

Figure 3:
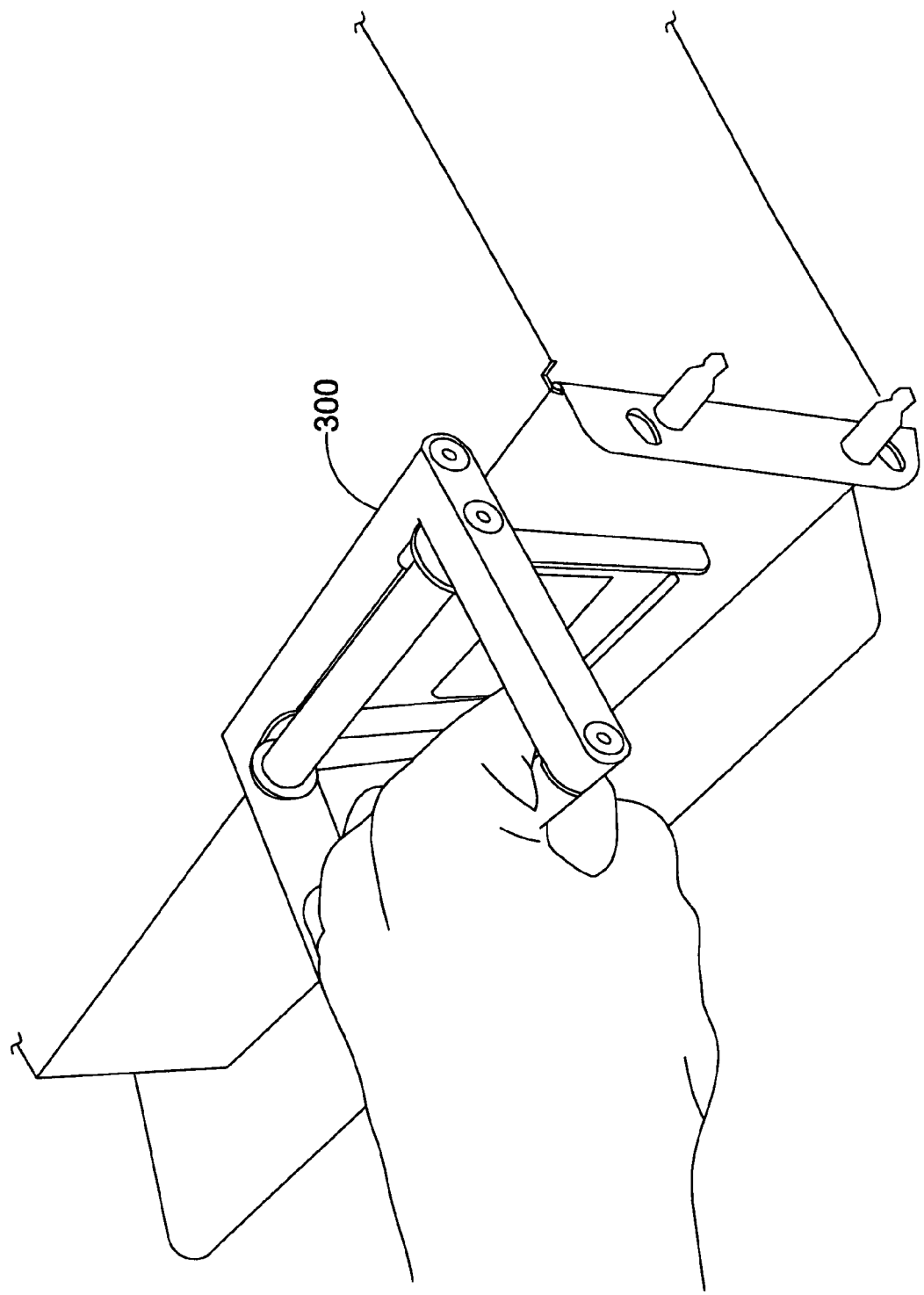
FIG. 3 depicts a detailed view of a removable handle for a computing appliance chassis assembly in accordance with an embodiment of the invention.

Referring to FIG. 3, a detailed view of a removable handle 300 removably mounted to the computing appliance chassis assembly 100 in accordance with an embodiment of the invention is shown. In an embodiment of the invention, removable handle 300 may be removable via a tool-less release. In an embodiment of the invention, removable handle 300 may be partially inserted, upon partial insertion, the pulling of a lever of the handle 300 upwards may fully insert the handle. The removable handle 300 may be removable by rotating the handle down towards a base, or bottom edge, of the computing appliance chassis assembly 100. When this occurs, handle 300 may be released. Installation of the handle 300 may be inserted from the release position, and rotated to an upright position. In an embodiment of the invention, a frictional component may be incorporated within handle 300 whereby the handle, when placed in an upright position for transport, may remain in the upright position.

It is contemplated that removable handle 300 may be incorporated within a variety of designs of computing appliance chassis assemblies. Furthermore, in storage applications with multiple computing appliances, one set of four (4) handles may be utilized for the transportation, installation and removal of a plurality of computing appliance chassis assemblies. This may remove the necessity of maintaining a set of handles for each computing appliance chassis assembly.

Figure 4:
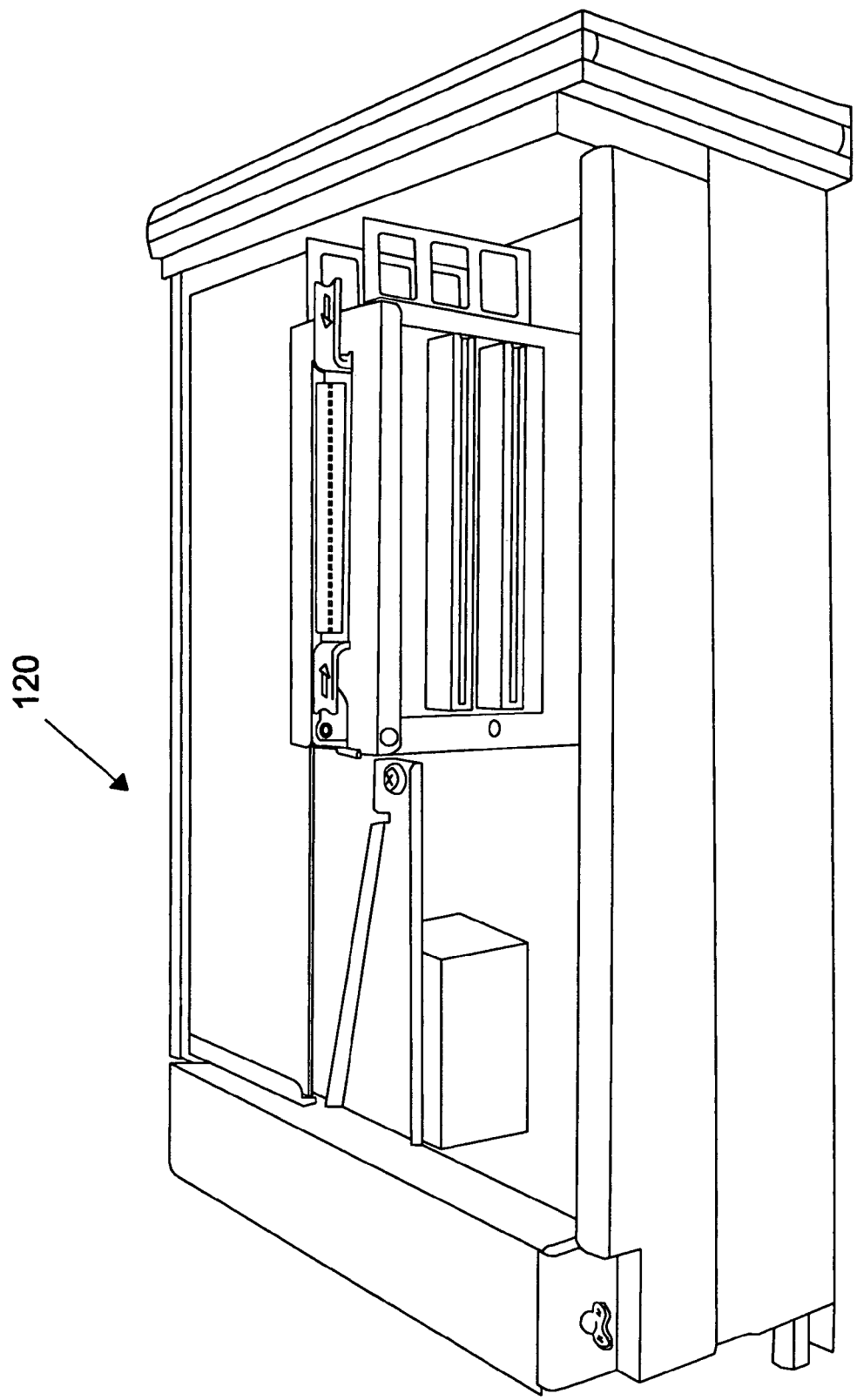
FIG. 4 depicts a controller chassis in accordance with an embodiment of the invention.

Referring now to FIG. 4, a controller chassis 120 in accordance with an embodiment of the invention is shown. Controller chassis 120 may house components associated with control of the computing appliance. In an embodiment of the invention, controller chassis assembly may include components of a motherboard. This may include a processing unit, cards such as network cards, memory, bus and the like. It is contemplated that various combinations of components, including software, hardware and firmware, may be provided by those with ordinary skill in the art within a controller module which would not depart from the scope and intent of the present invention. Integration of the components associated with the control of a computing appliance within a controller chassis assembly may allow for easier testing, maintenance and repair since the controller chassis 120 may be removably mounted within the computing appliance chassis assembly 100 of FIG. 1.

Figure 5:
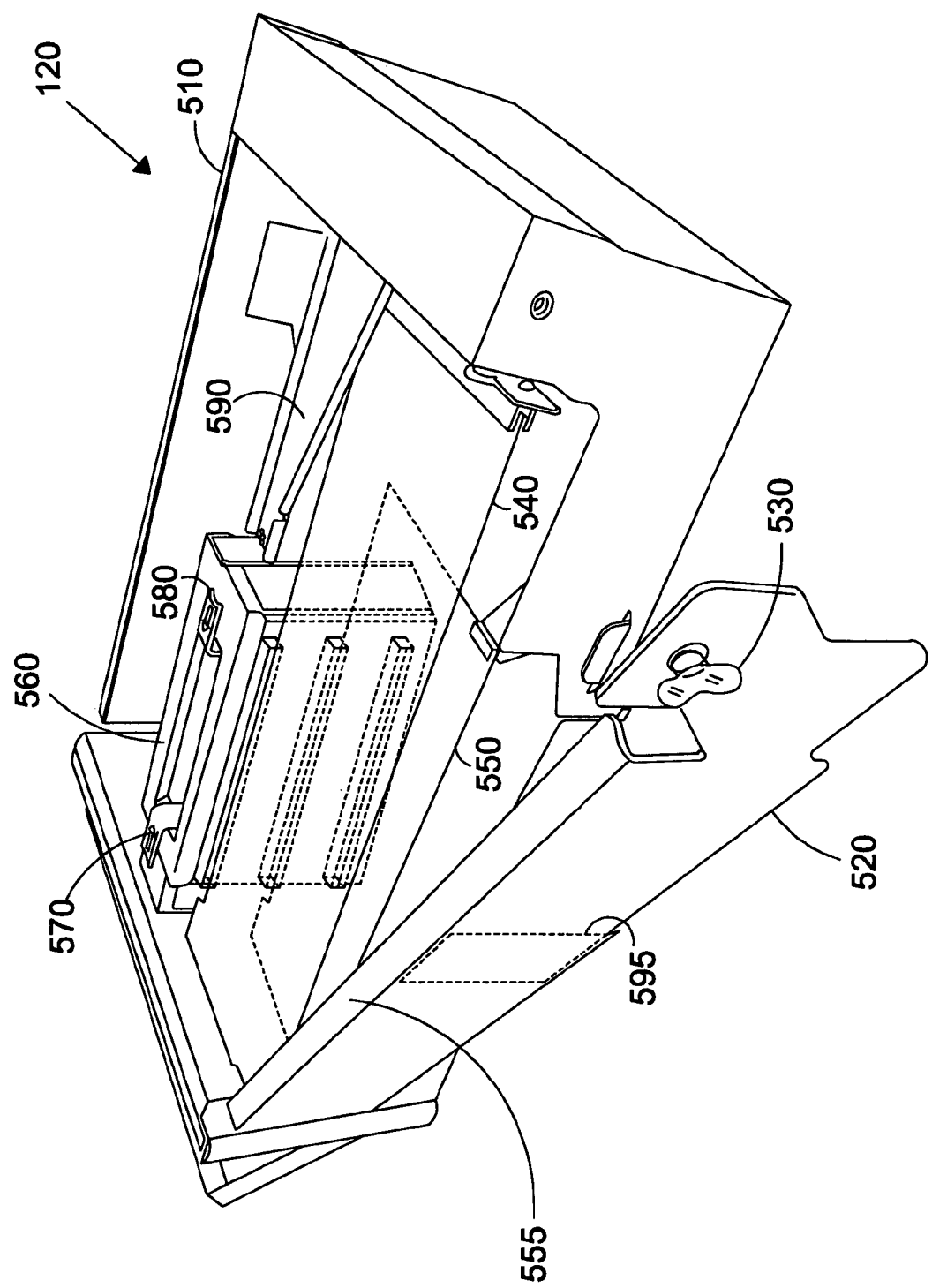
FIG. 5 depicts a controller chassis including rotatable side panels in accordance with an embodiment of the present invention.

Referring to FIG. 5, a controller chassis 120 including side panels 510, 520 in accordance with an embodiment of the present invention is shown. In one embodiment of the invention, side panels 510, 520 may be fixed at one side of the controller chassis 120 and may rotate outwardly from the interior of the controller chassis 120. This may provide quick and easy access to cards and components housed within the controller chassis 120. In an embodiment of the invention, side panels 510, 520 may be released via a tool-less release mechanism 530. Tool-less release mechanism 530 may be a rotatable pin, such as a key. For example, the rotatable pin may require a quarter-turn to release side panel 520 from the controller chassis 120. In an alternative embodiment of the invention, side panels 510, 520 may be removably mounted to a controller chassis 120 to allow access to cards and components with multiple tool-less release mechanisms.

Side panels 510, 520 may provide lateral support protection for cards 540, 550. Side panels 510, 520 may include an integrated compressible material 595 whereby the compressible material 595 may apply pressure to cards 540, 550 to secure the cards in contact with their respective connectors. Additionally, side panels 510, 520 may include a protruding rim 555. Protruding rim 555 may provide enhanced protection for the cards 540, 550. The protruding rim 555 may provide a gripping structure for a user's fingers in transport of the device without damaging cards 540, 550 and other components. It is contemplated that protruding rim 555 may extend further to provide additional protection of cards and components of the controller chassis 120 without departing from the scope and intent of the present invention.

Figure 6:
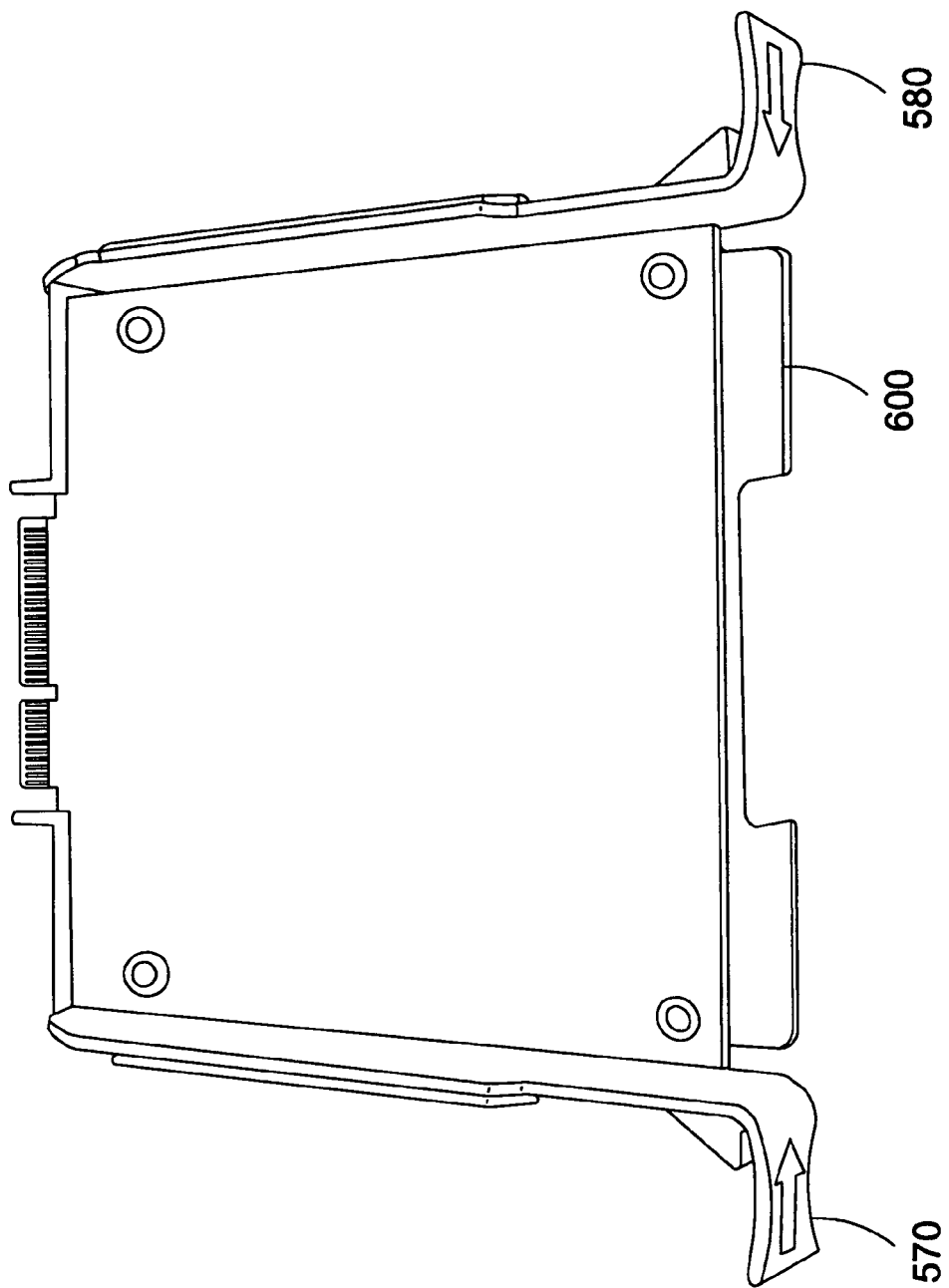
FIG. 6 depicts an exemplary card suitable for placement within a receptacle of controller chassis in accordance with an embodiment of the present invention.

Controller chassis 120 may include a spring-loaded receptacle 560 for receiving a card in accordance with an embodiment of the present invention. In an embodiment of the invention, spring-loaded receptacle 560 may be suitable for receiving a card, such as a network card. Receptacle 560 may be configured whereby the card may only be received when the card is inserted properly to allow correct installation of the card. When the card has been inserted correctly, the card may be secured by a spring-loaded latch. A card may be removed from the spring-loaded receptacle 560 by squeezing tabs 570, 580 toward the card. This may allow proper installation of the card while reducing inefficiency associated with testing and maintenance of the card. FIG. 6 depicts an exemplary card 600, including tabs 570, 580 suitable for placement within receptacle 560.

Referring once again to FIG. 5, controller chassis 120 may also include a butterfly arrangement of cards 540, 550 to allow dense packing of cards. Cards 540, 550 may be mountable within a stack, coupled to ports, the ports being mounted to receptacle 560. Cards 540, 550 may be Peripheral Component Interconnect (PCI) cards. In an embodiment of the invention, a second column of cards (not shown) may be placed in a stack next to cards 540, 550. A second stack of cards may also be coupled to ports, the ports being mounted to receptacle 560. Receptacle 560 may operate in combination with beam 590 to form a center support structure. This may add rigidity to the chassis and provide additional protection to components of the controller chassis 120.

Side panels 510, 520 may be sufficiently rigid whereby controller chassis may be placed upon a side panel 510, 520. This may allow easier removal and installation of cards 540, 550. Additionally, access may be more easily achieved and mechanical advantage may be ascertained for the installation of cards 540, 550.

Figure 7:
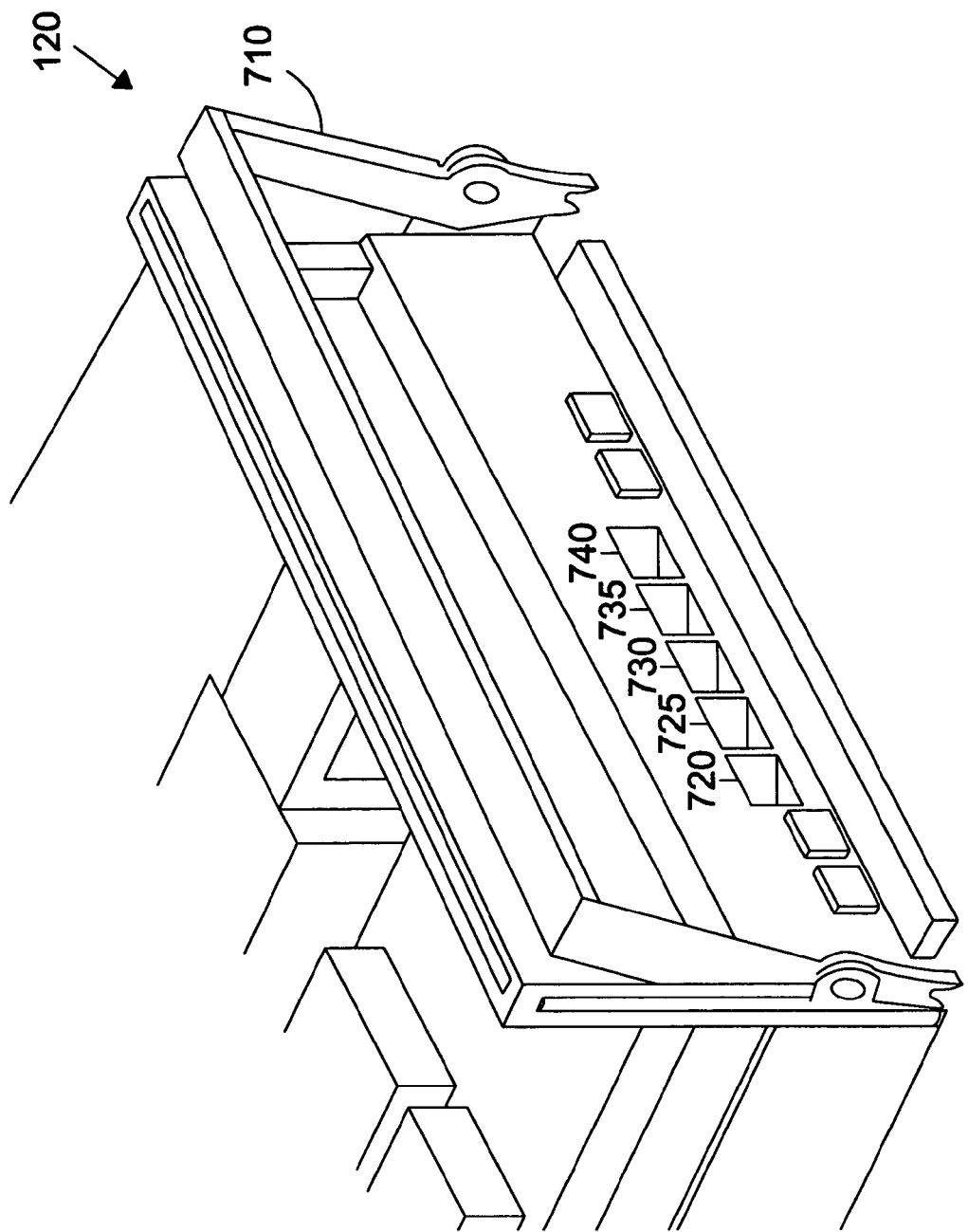
FIG. 7 depicts a rear view of a controller chassis in accordance with an embodiment of the present invention.

Referring to FIG. 7, a rear view of a controller chassis 120 in accordance with an embodiment of the present invention is shown. In an embodiment of the invention, controller chassis 120 may include a handle 710. Handle 710 may aid the user in the installation and removal of controller chassis 120 to and from the computing appliance chassis assembly. Additionally, handle 710 may aid the user in the transport of controller chassis 120. Controller chassis 120 may include a plurality of receptacles 720, 725. 730, 735, and 740. Receptacles 720, 725, 730, 735, and 740 may refer to ports and the like suitable for receiving hardwire connections for transfer of data and for receiving power.

Figure 8:
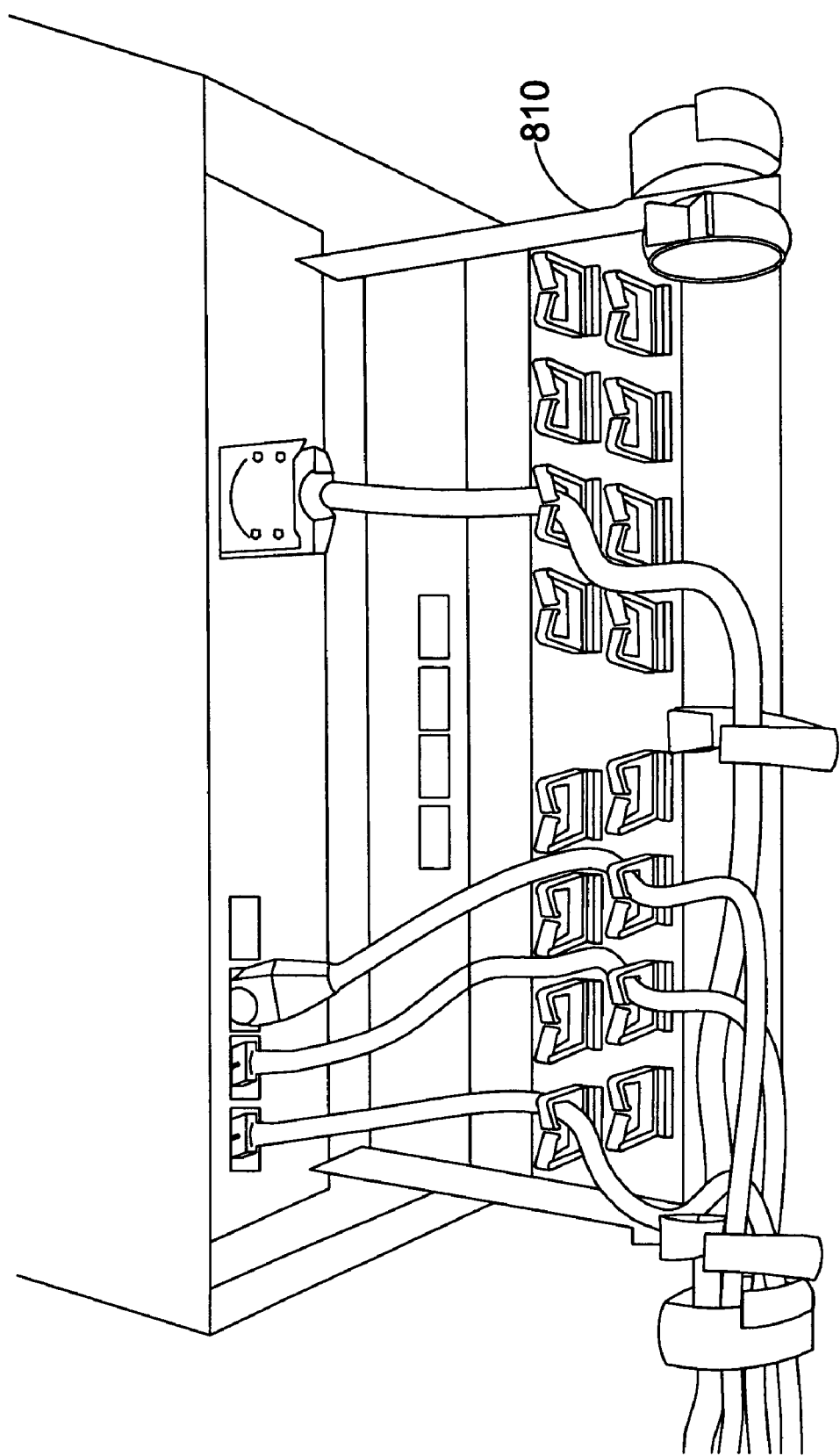
FIG. 8 a removable cable tray in accordance with an embodiment of the present invention.

Referring to FIG. 8, a removable cable tray 810 in accordance with an embodiment of the present invention is shown. In an embodiment of the invention, controller chassis 120 may be secured within the rear section of a computing appliance chassis assembly 100 of FIG. 1. When mounted within a storage rack, hardwire connections may be received from the rear of the storage rack. Cable tray 810 may be mounted to the rear of controller chassis 120 to aid a user in the installation, testing and repair of the computing appliance.

Figure 9:
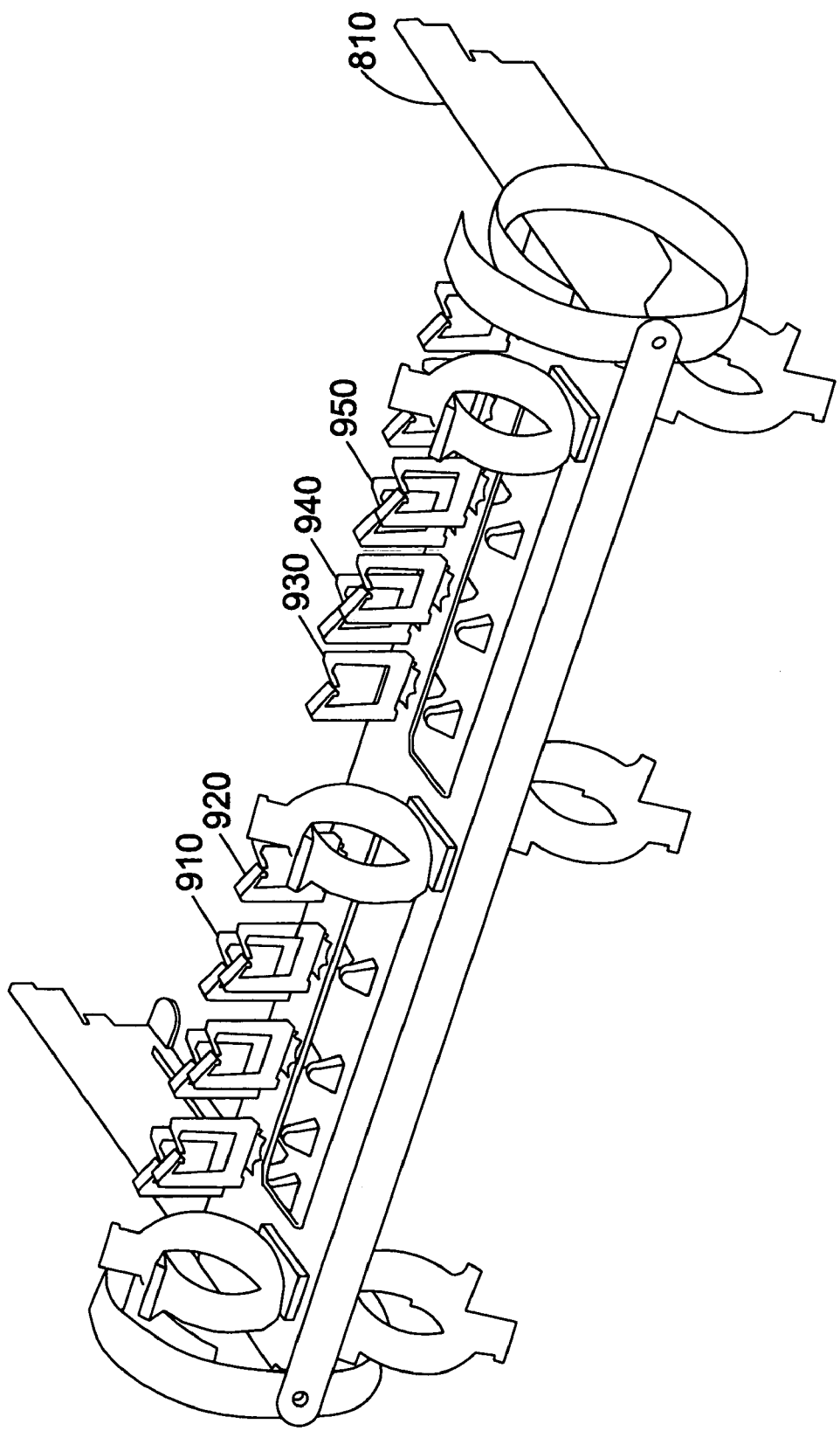
FIG. 9 depicts a perspective view of a removable cable tray in accordance with an embodiment of the invention.
Figure 10:
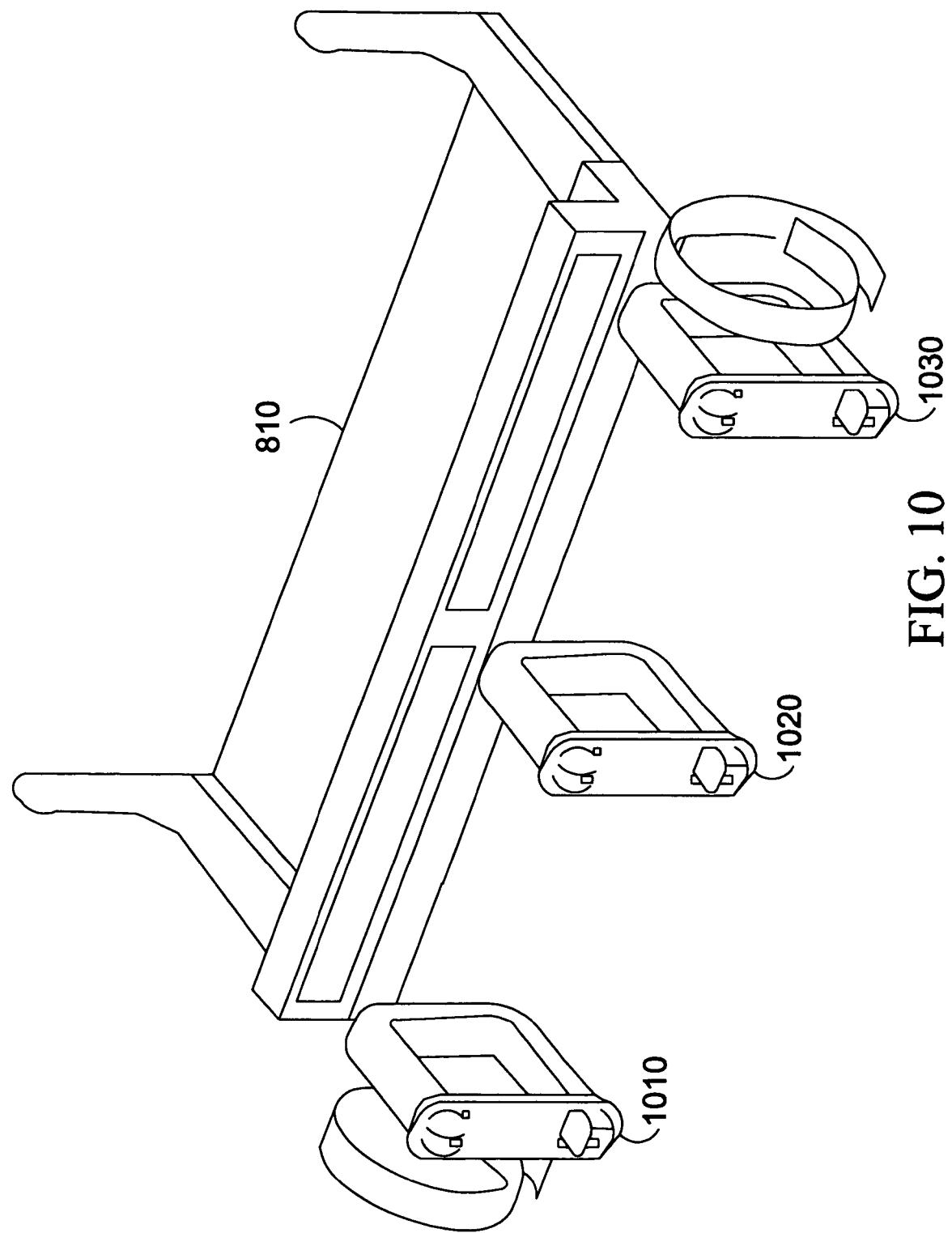
FIG. 10 depicts a removable cable tray including D-rings in accordance with an embodiment of the present invention.
Figure 11:
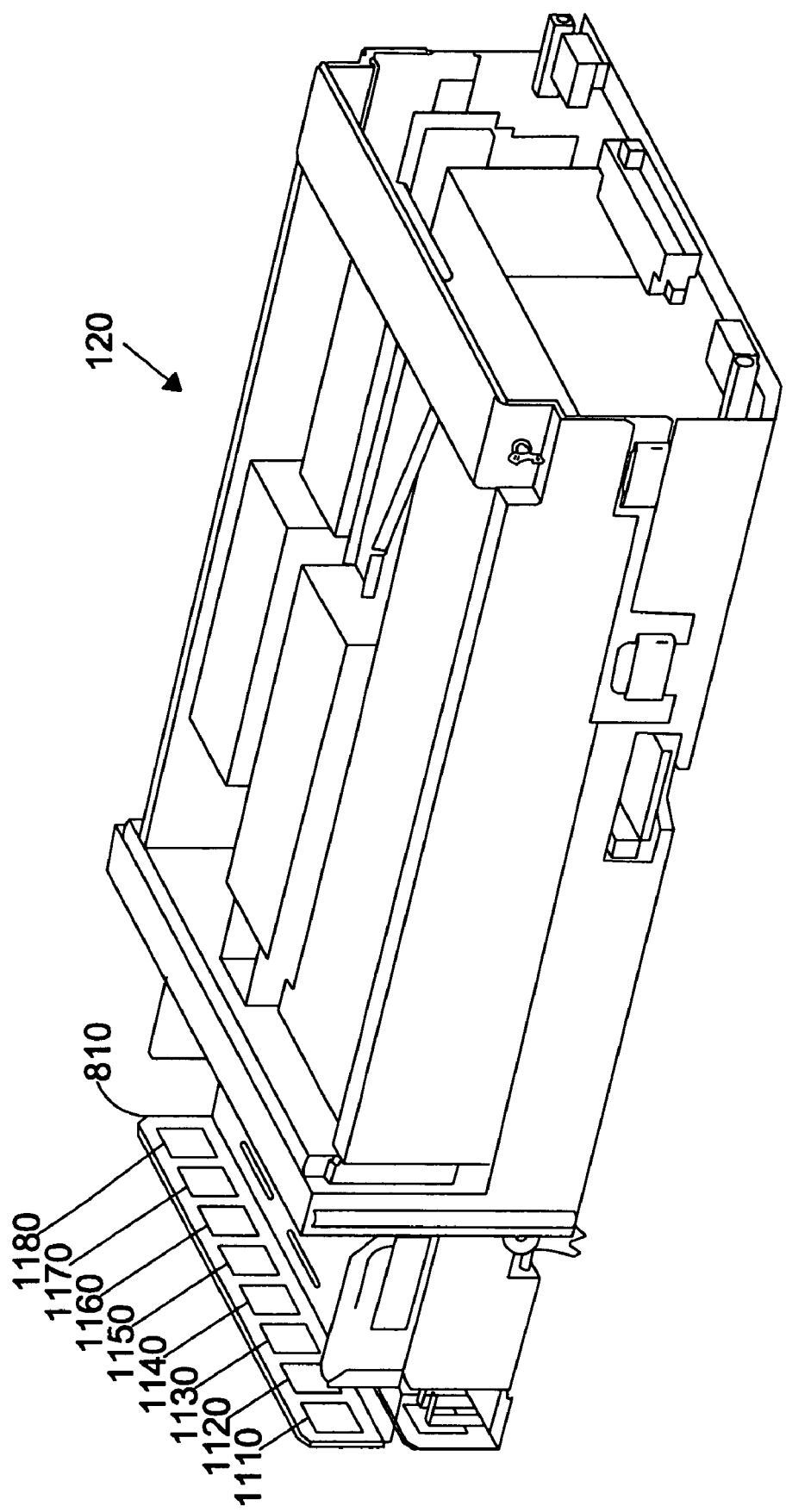
FIG. 11 depicts a controller chassis including a removable cable tray in accordance with an alternative embodiment of the present invention.

Referring to FIG. 9, a perspective view of a removable cable tray 810 in accordance with an embodiment of the invention is shown. Removable cable tray 810 may include a plurality of guide channels 910, 920, 930, 940, and 950 whereby cables may be secured. In an embodiment of the invention, guide channels 910, 920, 930, 940, and 950 may secure cables corresponding to the appropriate port or receptacle of the controller chassis 120. If the controller chassis 120 needs to be removed from the computing appliance chassis assembly 100, cables may be disconnected, then the removable cable tray 810 may be disconnected. When the controller chassis 120 is re-installed within the computing appliance chassis assembly 100, removable cable tray 810 may be re-mounted with the controller chassis 120. The cables may be in the area corresponding to the appropriate port or receptacle of the controller chassis assembly to reduce time spent re-connecting the cables. FIG. 10 depicts a removable cable tray 810 with D-rings 1010-1030. D-rings 1010, 1020, and 1030 may manage cables passing through each D-ring 1010, 1020, and 1030. In an embodiment of the invention, D-rings 1010, 1020, and 1030 may be removably mounted to removable cable tray 810. For example, D-rings may be removably mounted to removable cable tray 810 via a belt-clip mechanism. Referring to FIG. 11, a controller chassis 120 including a removable cable tray 810 in accordance with an alternative embodiment of the present invention is shown. Removable cable tray 810 may include a plurality of apertures 1110, 1120, 1130, 1140, 1150, 1160, 1170, and 1180 on different levels suitable for feeding cables.

Figure 12:
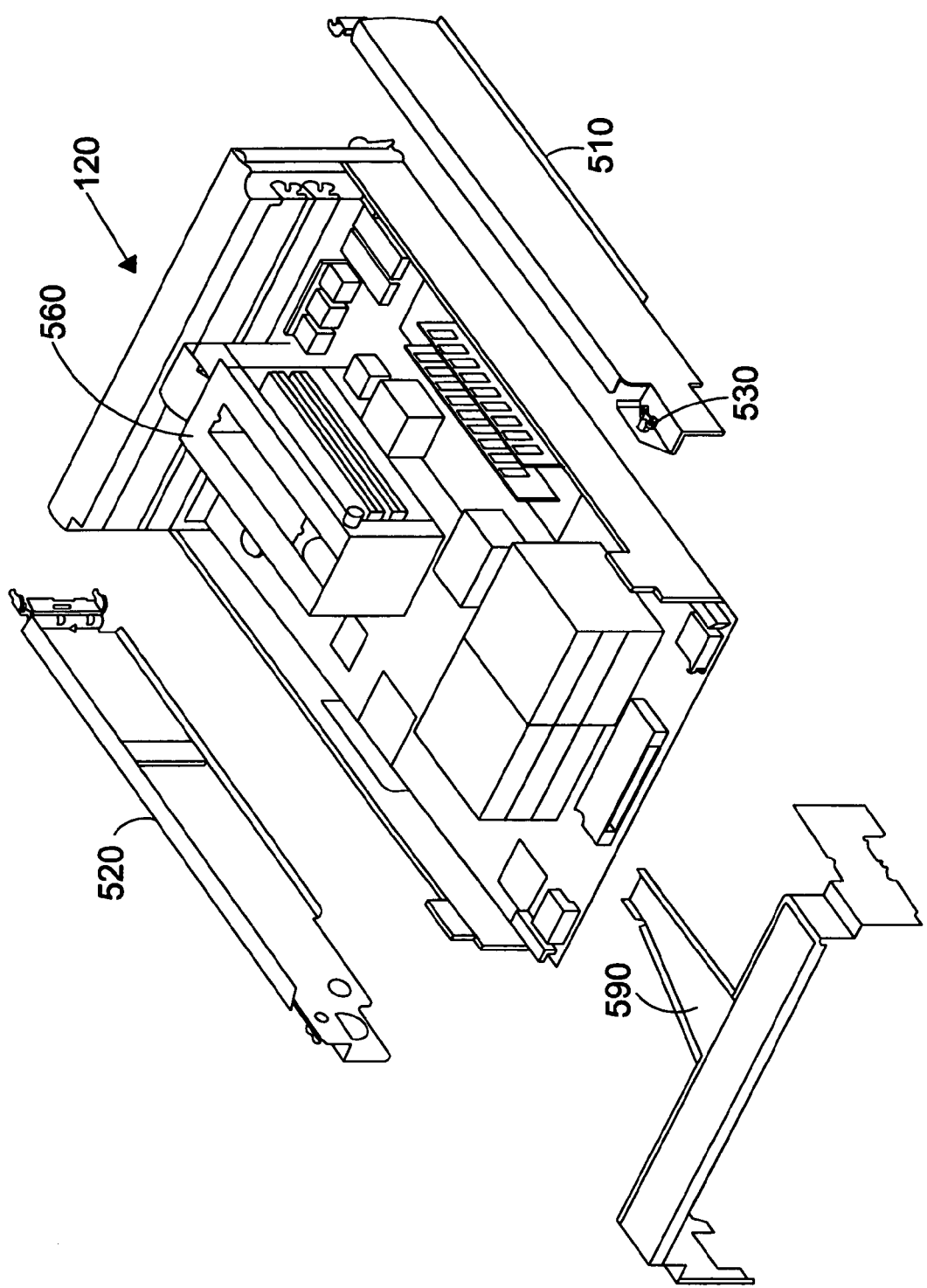
FIG. 12 depicts an exploded view of a controller chassis in accordance with the present invention.
Figure 13:
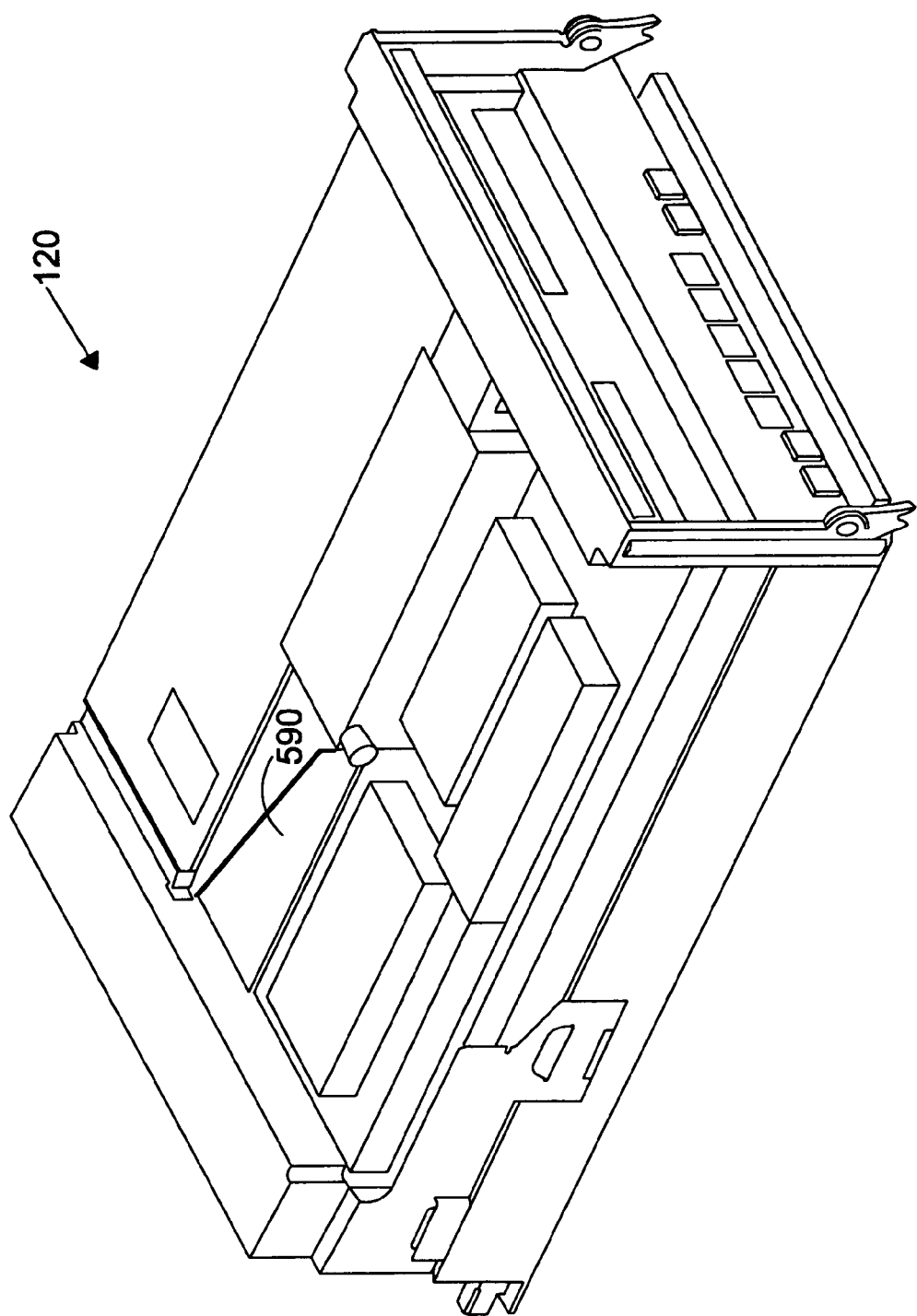
FIG. 13 depicts a perspective view of a controller chassis in accordance with an embodiment of the present invention.

Referring to FIG. 12, an exploded view of a controller chassis 120 in accordance with the present invention is shown. In an embodiment of the invention, controller chassis 120 may include a beam 590. Beam 590 may prevent the controller chassis from contacting other components within a computing appliance chassis assembly. Beam 590 may also couple receptacle 560 to the front of the computer appliance chassis assembly 100 which may provide enhanced rigidity for the computer appliance chassis assembly 100. FIG. 13 depicts a perspective view of a controller chassis 120 in accordance with an embodiment of the present invention.

Figure 14:
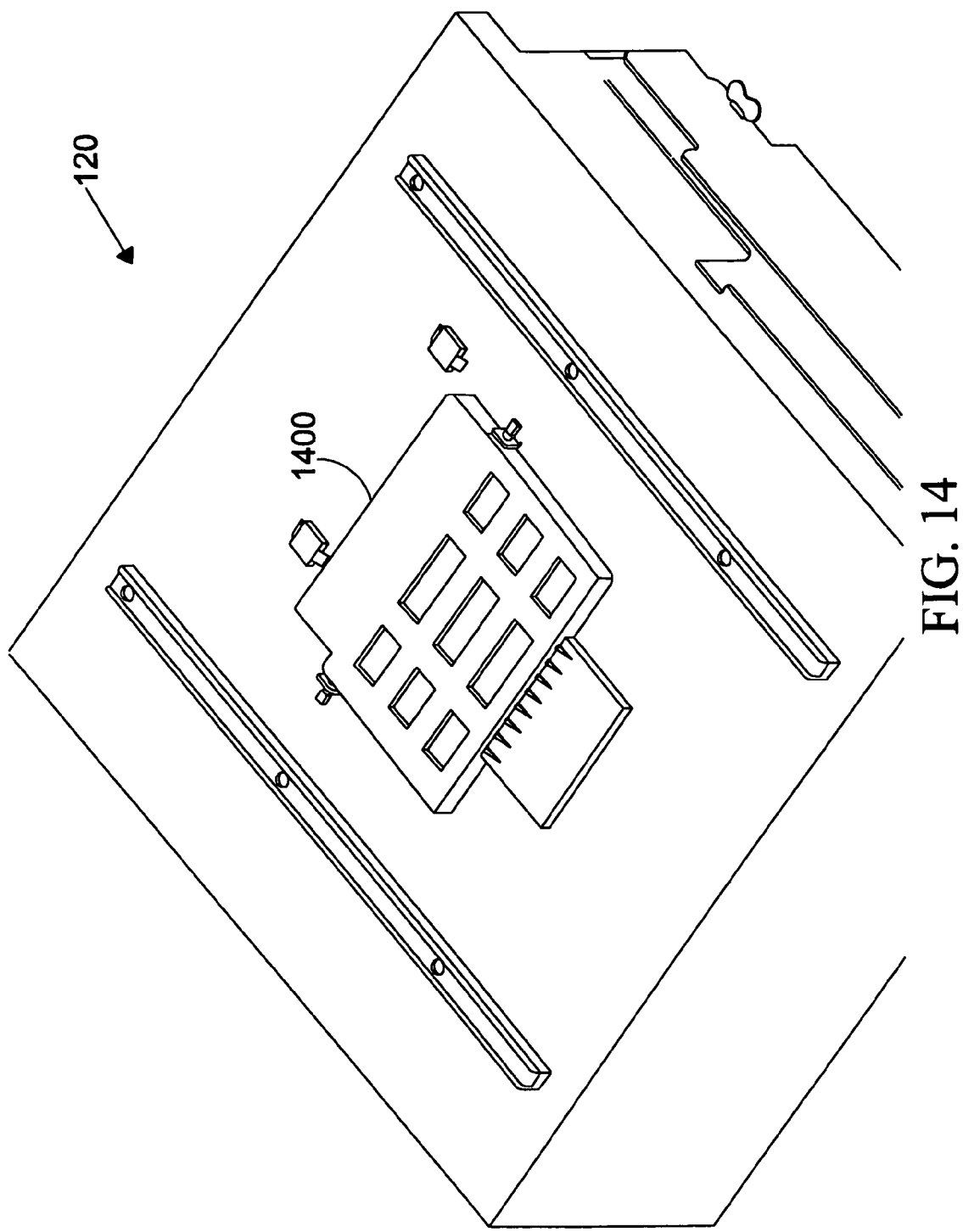
FIG. 14 depicts a controller chassis including a releasable latch in accordance with an embodiment of the present invention.

Referring to FIG. 14, a controller chassis 120 including a latching paddle 1400 in accordance with an embodiment of the present invention is shown. Latching paddle 1400 may be utilized to secure controller chassis 120 within a computing appliance chassis assembly. Additionally, latching paddle 1400 may prevent the controller chassis 120 from being removed inadvertently from the computing appliance chassis assembly. Latching paddle 1400 may be released by lifting controller chassis 120 over a locking plate of computing appliance chassis assembly or alternatively by striking a release of latching paddle 1400. Latching paddle 1400 may also prevent the controller chassis 120 from an unintended fall when removing the controller chassis from a computing appliance chassis assembly. In one embodiment of the invention, when the controller chassis 120 has been pulled from the computing appliance chassis assembly, it may strike a lock plate. This may identify that the controller chassis is almost removed since it may be difficult for one to know the length of the controller chassis. In such a fashion, the latching paddle 1400 may operate similar for a drawer of a file cabinet whereby release of a latch may be required before a drawer is removable from the file cabinet.

Figure 15:
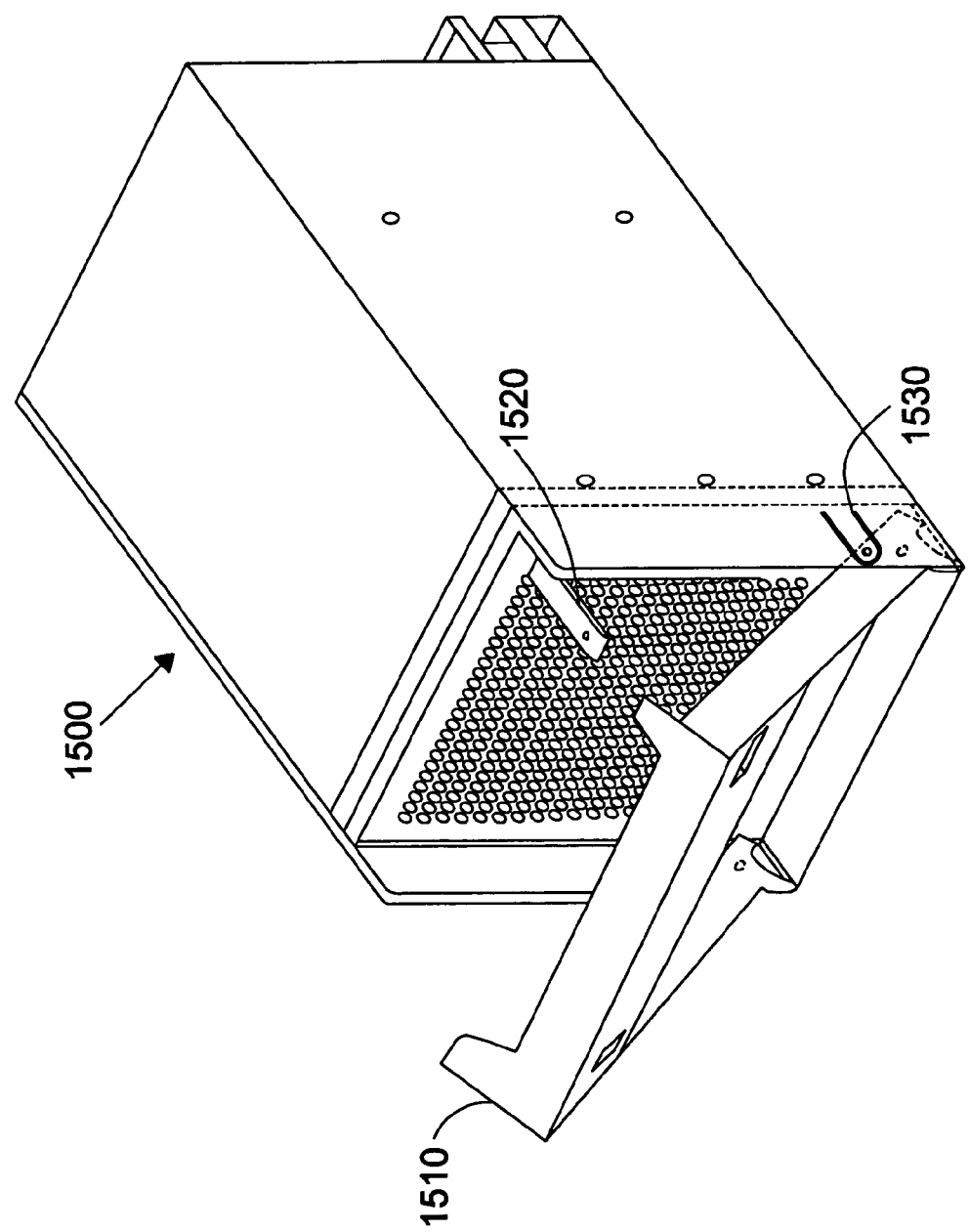
FIG. 15 depicts a fan chassis in accordance with an embodiment of the present invention.

Referring to FIG. 15, a fan chassis 1500 in accordance with an embodiment of the present invention is shown. It is contemplated that fan chassis 1500 may be representative of fan chassis 130, 140 of FIG. 1. Fan chassis 1500 may be removably mountable within a computing appliance chassis assembly and may allow quick and efficient installation/removal. Fan chassis 1500 may include a handle 1510 for aiding installation of fan chassis 1500 within a computing appliance chassis assembly. Additionally, handle 1510 may aid a user in transport of fan chassis 1500. Latch 1520 may secure the handle in a fixed position when the fan chassis 1500 is secured within a computing appliance chassis assembly. Latch 1520 may also operate in conjunction with release mechanism 1530 whereby the fan chassis 1500 may be released from a computing appliance chassis assembly by pulling/pushing the handle 1510 outwards from the fan chassis 1500. When fan chassis 1500 is installed, latch 1520 and release mechanism 1530 may operate to secure fan chassis 1500 within a computing appliance chassis assembly.

Figure 16:
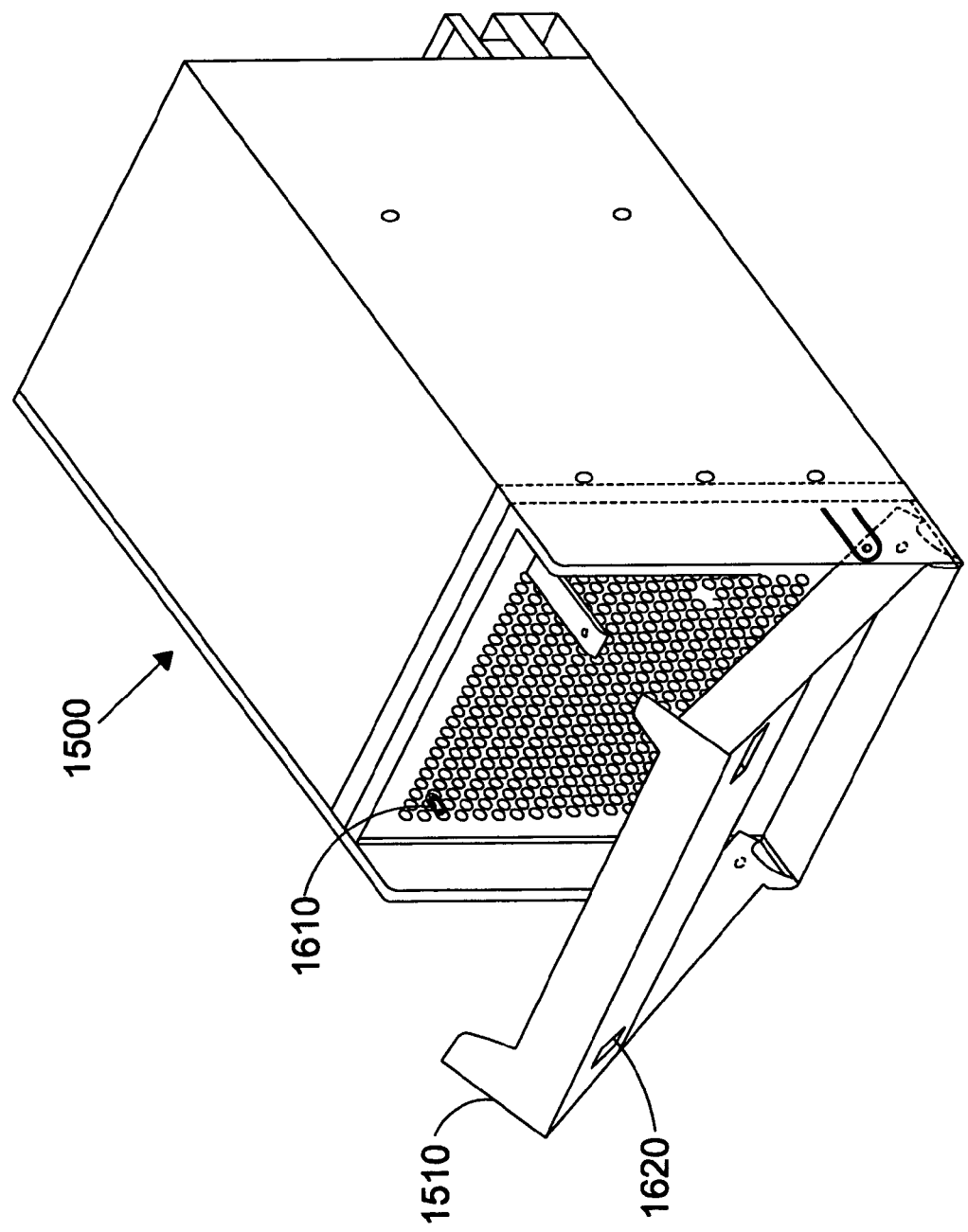
FIG. 16 depicts a fan chassis including a lightpath embedded within a handle in accordance with an embodiment of the present invention.

Referring now to FIG. 16, fan chassis 1500 including a visible alert 1610 and lightpath 1620 embedded within a handle 1510 in accordance with an embodiment of the present invention is shown. In an embodiment of the invention, fan chassis 1500 may include a visible alert 1610. Visible alert 1610 may indicate if a fan is not operating properly. Additionally, visible alert 1610 may indicate a failure of the fan chassis 1500. In an embodiment of the invention, visible alert 1610 may be a light emitting diode. Visible alert 1610 may be coupled with a lightpath 1620 embedded within a handle 1510 of the fan chassis 1500. Lightpath 1620 may enhance the visibility of the visible alert 1610 for a user allowing easier detection by the user when the handle 1510 is placed in a stored position.

Figure 17:
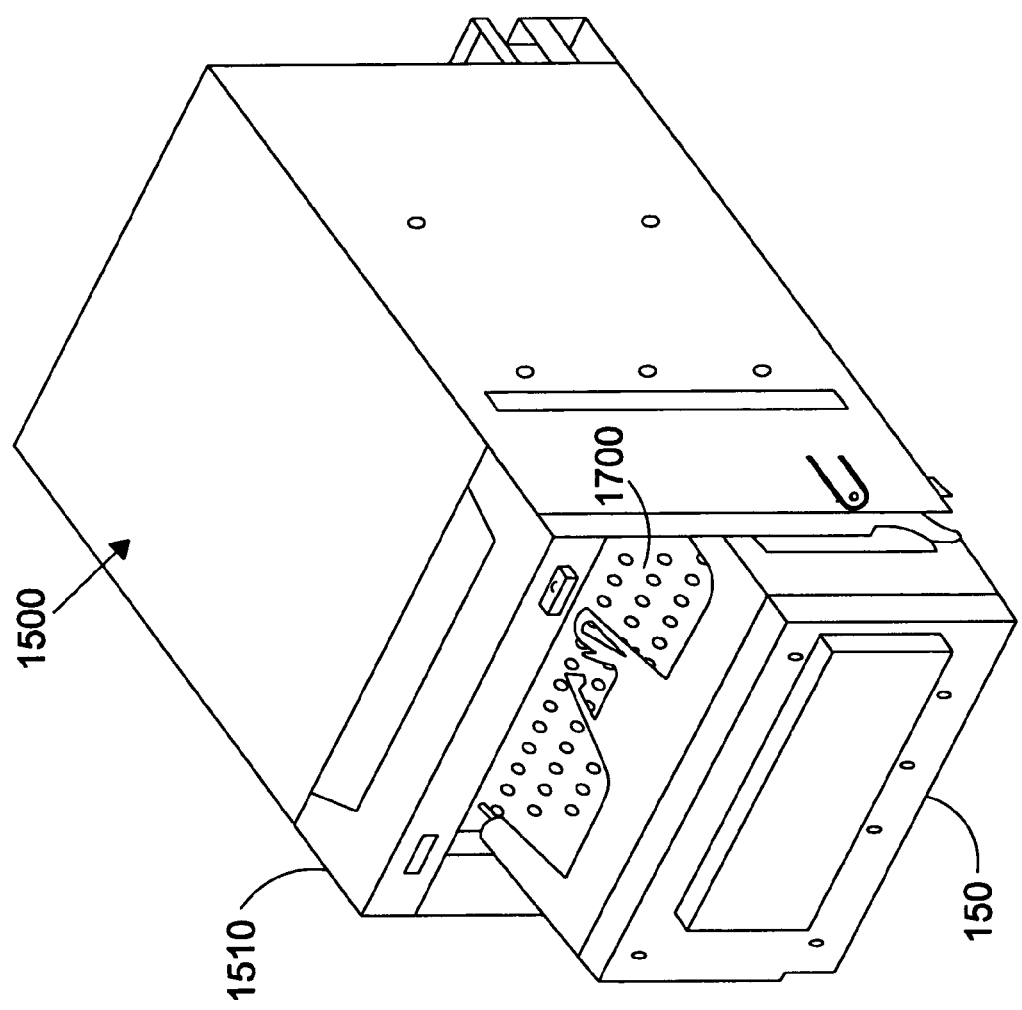
FIG. 17 depicts a fan chassis including a detachable visible display in accordance with an embodiment of the present invention.

Referring now to FIG. 17, a fan chassis 1500 including a detachable visible display module 150 in accordance with an embodiment of the present invention is shown. Visible display 150 may be a liquid crystal display (LCD). Detachable visible display 150 may provide status and operating information regarding the computing appliance chassis assembly. It is contemplated that visible display 150 may receive power from the fan chassis 1500. In one embodiment of the invention, visible display 150 may receive power via grill 1700. Visible display 150 may be mounted to the grill 1700 of the fan chassis 1500 via guidance pins and cantilever spring latches. As described previously, fan chassis 1500 may be installed from a front portion of a computing appliance chassis assembly. Placing the visible display 150 on a grill 1700 of the fan chassis 1500 may allow viewing of the visible display 150 when the computing appliance chassis assembly is mounted within a storage rack.

It is believed that the method and system of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An apparatus, comprising:
    a chassis assembly, said chassis assembly including a base section, a top section, a first side and a second side defining a front opening and a rear opening, said chassis assembly further including a first handle removably coupled to said first side via a first tool-less release mechanism and a second handle removably coupled to said second side via a second tool-less release mechanism;
    a controller chassis removably mountable within said rear opening of said chassis assembly, said controller chassis including a receptacle for receiving a component, said controller chassis including a first side panel and two rotatable side panels;
    a power supply removably mountable within said rear opening of said chassis assembly; and
    a fan chassis removably mountable within said front opening of said chassis assembly, said fan chassis housing a fan, wherein said controller chassis and said fan chassis are secured within said chassis assembly via a spring-mounted latch, said two rotatable side panels being fixed at said first side of said controller chassis and rotatable outwardly from an interior of the controller chassis, one of said two rotatable side panels being released via a third tool-less release mechanism.

2. The apparatus as claimed in claim 1, wherein said controller chassis is configured for housing a plurality of cards, said plurality of cards being mountable within a stack.

3. The apparatus as claimed in claim 1, wherein said controller chassis includes a latching paddle.

4. The apparatus as claimed in claim 3, wherein said latching paddle secures the controller chassis within the chassis assembly.

5. The apparatus as claimed in claim 1, wherein said fan chassis includes a visible alert mounted within a grill of said fan chassis.

6. The apparatus as claimed in claim 5, wherein said visible alert is enabled upon a failure of said fan chassis.

7. The apparatus as claimed in claim 1, wherein said fan chassis includes a visible display mounted to a grill of said fan chassis.

8. The apparatus as claimed in claim 1, wherein said fan chassis includes a handle.

9. The apparatus as claimed in claim 8, wherein said handle includes a lightpath coupled to a visible alert, said visible alert being mounted within a grill of said fan chassis.

10. The apparatus as claimed in claim 1, further comprising a detachable cable tray removably mounted to said controller chassis.

11. The apparatus as claimed in claim 1, wherein each of said two rotatable side panels includes a protruding rim, said protruding rim provides a gripping structure for said controller chassis.

12. The apparatus as claimed in claim 1, wherein said component includes at least one of a processing unit, card or memory.

13. The apparatus as claimed in claim 1, wherein said first handle being removable via said first tool-less release mechanism from said first side through rotation of said first handle from an upright position to a release position, said second handle being removable from said second side via said second tool-less release mechanism through rotation of said second handle from an upright position to a release position.

14. A computing appliance, comprising:
    a chassis assembly, said chassis assembly including a base section, a top section, a first side and a second side defining a front opening and a rear opening, said chassis assembly further including a first handle removably coupled to said first side and a second handle removably coupled to said second side;

a controller chassis removably mountable within said rear opening of said chassis assembly, said controller chassis including a receptacle for receiving a component, said controller chassis including a first side panel and two rotatable side panels; and a fan chassis removably mountable within said front opening of said chassis assembly, said fan chassis housing a fan, wherein said controller chassis and said fan chassis are secured within said chassis assembly via a spring-mounted latch, said two rotatable side panels being fixed at said first side of said controller chassis and rotatable outwardly from an interior of the controller chassis, one of said two rotatable side panels being released via a tool-less release mechanism, one of said two rotatable side panels securing said component in contact with said receptacle when said one of said two rotatable side panels are coupled with said controller chassis through the tool-less release mechanism.

15. The computing appliance as claimed in claim 14, wherein said controller chassis is configured for housing a plurality of cards, said plurality of cards being mountable within a stack.

16. The computing appliance as claimed in claim 14, wherein said controller chassis includes a latching paddle.

17. The computing appliance as claimed in claim 16, wherein said latching paddle secures the controller chassis within the chassis assembly.

18. The computing appliance as claimed in claim 14, wherein said fan chassis includes a visible alert mounted within a grill of said fan chassis.

19. The computing appliance as claimed in claim 18, wherein said visible alert is enabled upon a failure of said fan chassis.

20. The computing appliance as claimed in claim 14, wherein said fan chassis includes a visible display mounted to a grill of said fan chassis.

21. The computing appliance as claimed in claim 14, wherein said fan chassis includes a handle.

22. The computing appliance as claimed in claim 21, wherein said handle includes a lightpath coupled to a visible alert, said visible alert being mounted within a grill of said fan chassis.

23. The computing appliance as claimed in claim 14, further comprising a detachable cable tray removably mounted to said controller chassis.

24. The computing appliance as claimed in claim 14, wherein each of said two rotatable side panels includes a protruding rim, said protruding rim provides a gripping structure for said controller chassis.

25. The computing appliance as claimed in claim 14, further comprising a power supply removably mountable within said rear opening of said chassis assembly.

26. The computing appliance as claimed in claim 14, wherein said component includes at least one of a processing unit, card or memory.

27. The computing appliance as claimed in claim 14, wherein said first handle is removably coupled to said first side via a second tool-less release mechanism and a second handle is removably coupled to said second side via a third tool-less release mechanism.

28. The computing appliance as claimed in claim 27, wherein said first handle is removable from said first side via said second tool-less release mechanism through rotation of said first handle from an upright position to a release position, said second handle is removable from said second side via said third tool-less release mechanism through rotation of said second handle from an upright position to a release position.

29. The computing appliance as claimed in claim 14, wherein said one of said two rotatable side panels securing said component in contact with said receptacle includes a compressible material in contact with said component.

* * * * *